United States Patent [19]

DeMercurio et al.

[11] Patent Number: 5,294,520
[45] Date of Patent: Mar. 15, 1994

[54] ZERO UNDERCUT ETCH PROCESS

[75] Inventors: Thomas A. DeMercurio, Beacon; Richard J. Hetherington, Pine Plains; Robert A. Meyen, Salt Point; Scott A. Sands, Hopewell Junction, all of N.Y.

[73] Assignee: International Business Machines Corporation, Armonk, N.Y.

[21] Appl. No.: 934,993

[22] Filed: Aug. 25, 1992

[51] Int. Cl.⁵ .............................................. G03C 5/00
[52] U.S. Cl. ........................................ 430/314; 430/313; 430/318; 430/394; 156/659.1; 156/661.1
[58] Field of Search ............... 430/311, 313, 314, 318, 430/319, 394, 396; 156/659.1, 660, 661.1

[56] References Cited

U.S. PATENT DOCUMENTS

| | | | |
|---|---|---|---|
| 4,409,262 | 10/1983 | Jelks et al. | 427/99 |
| 4,470,872 | 9/1984 | Sudo | 430/314 |
| 4,526,859 | 7/1985 | Christensen et al. | 430/314 |
| 4,591,547 | 5/1986 | Brownell | 430/314 |
| 4,654,295 | 3/1987 | Yang et al. | 430/314 |
| 4,687,730 | 8/1987 | Eron | 430/324 |
| 4,702,792 | 10/1987 | Chow et al. | 156/628 |

FOREIGN PATENT DOCUMENTS 59-193452  11/1984  Japan .

*Primary Examiner*—Marion E. McCamish
*Assistant Examiner*—Kathleen Duda
*Attorney, Agent, or Firm*—Whitham & Marhoefer

[57] ABSTRACT

A process in the fabrication of wiring patterns on ceramic or polymeric substrates precisely controls the cross-sectional dimensions of the metallization that constitute the wiring patterns. A single etch process defines thin film conductors on a substrate without loss to the conductor cross-section and provides enhanced thin film design flexibility. The zero undercut etch process uses photoresists defining the metal patterns to completely protect the metal patterns during the subetch.

7 Claims, 2 Drawing Sheets

PLANARIZED SUBSTRATE ENTERING THIN FILMS

PHOTORESIST APPLIED AND PATTERN DEVELOPED THIKNESS 5um OR MORE

BLANKET METALLIZATION OF Cr/Cu/Cr. Cu THICKNESS 4um OR MORE

PHOTORESIST APPLIED AND PATTERN DEVELOPED

Cr/Cu/Cr SUBETCH

PHOTORESIST REMOVAL

ZERO UNDERCUT ETCH PROCESS

BACKGROUND OF THE INVENTION

1. Field of the Invention

The present invention generally relates to manufacturing processes for the production of thin film printed circuits as used for the interconnection of semiconductor devices, integrated circuits (ICs) and the like and, more particularly, to a zero undercut etch process that eliminates restrictions on the thickness and width of a photo developed image that can be etch defined.

2. Description of the Prior Art

Multilayer ceramic (MLC) is one technology that is widely used for fabricating dielectric substrate carriers for integrated circuits, semiconductor devices and other electronic components. As the packaging of electronic circuits and components has become increasingly dense, the wiring patterns have become finer and finer. However, a problem in the control of cross-sectional dimensions of the metallization has been encountered with the manufacture of ever finer wiring patterns. Specifically, conventional processes of forming the wiring patterns results in an undercut of the metallization, resulting in a significant decrease in the desired cross-sectional dimensions. One approach to a solution to this problem has been to form the wiring patterns "oversized" to compensate for the undercut. This has not been satisfactory as only an approximate dimension can be assured in the resulting wiring pattern.

SUMMARY OF THE INVENTION

It is therefore an object of the present invention to provide a process in the fabrication of wiring patterns on substrates wherein the cross-sectional dimensions of the metallization that constitute the wiring patterns can be precisely controlled.

The invention is a single etch process that defines thin film conductors on a substrate. Suitable substrates include ceramic, such as glass, alumina or glass-ceramic, and polyimide as well as other polymeric materials, although the invention is not limited to any specific substrate material. The substrate may be monolithic or multilayer. The etch process according to the invention is accomplished without loss to the conductor cross-section and provides enhanced thin film design flexibility. Specifically, it provides a zero undercut etch process wherein the photoresists defining the metal patterns completely protect the metal patterns during the etch.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
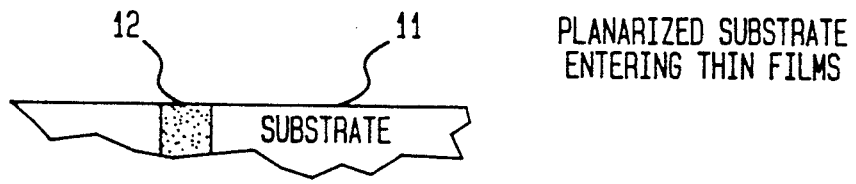
FIG. 1 is a cross-sectional view of a substrate at the beginning of the process according to the invention.

Referring now to the drawings, and more particularly to FIG. 1, there is shown a substrate 11 at the beginning of the process according to the invention. A thin film metallization is to be formed on the substrate 11 making electrical contacts with vias, indicated typically at 12, for a specific device or circuit. The substrate is most preferably planarized prior to entering the thin film processing, having been processed via conventional means.

Figure 2:
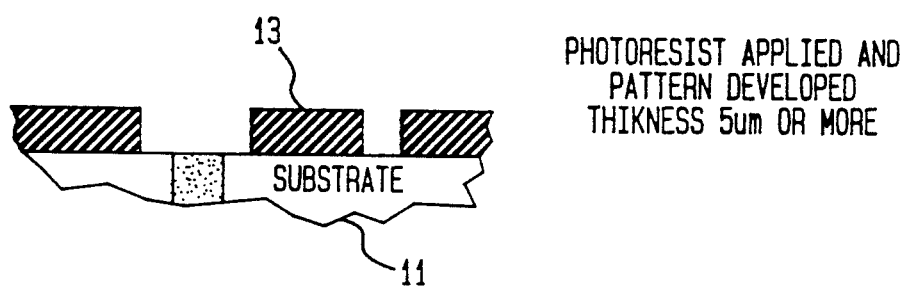
FIG. 2 is a cross-sectional view of the substrate after applying photoresist and the pattern photo developed.

In FIG. 2, a photoresist 13 capable of yielding, say, three to approximately five microns of thickness (after processing) is applied. The desired pattern is exposed and developed, thereby defining the desired metallization pattern.

Figure 3:
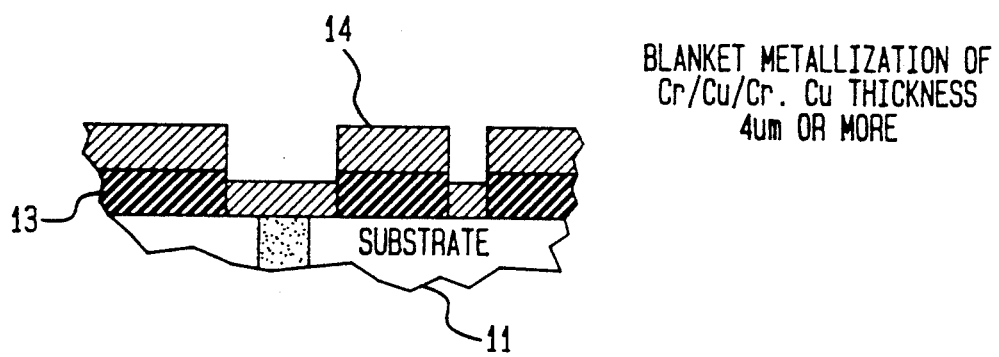
FIG. 3 is a cross-sectional view of the substrate after blanket metallization.

In FIG. 3, a chromium/copper/chromium (Cr/Cu/Cr) metal blanket 14 is applied using conventional processes. The Cu thickness is approximately one micron less than the thickness of the photoresist 13. Thus, for a thickness of three microns for the photoresist 13, the Cu thickness would be about two microns.

Figure 4:
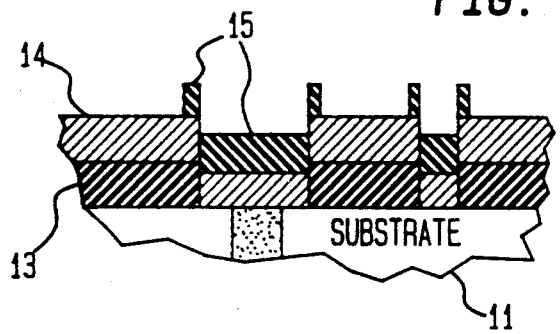
FIG. 4 is a cross-sectional view of the substrate after a second photoresist is applied and the pattern photo developed.

Next, in FIG. 4, a second photoresist 15 is applied. This photoresist is exposed and developed to provide a pattern image that covers and overlaps the pattern image formed in FIG. 2 with the first photoresist 13. FIG. 4 illustrates a novel feature of the invention. Specifically, the photoresist 15 protects the top of the metal feature desired, and the photoresist 13 protects the edges. Thus, the metal feature is completely protected during the subsequent etch process.

Figure 5:
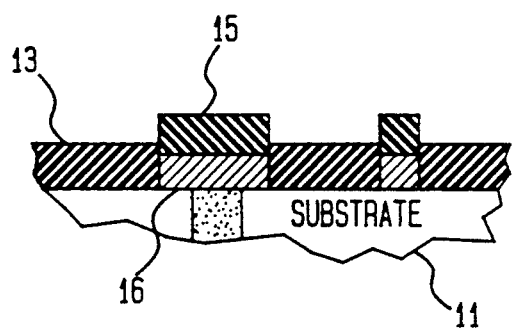
FIG. 5 is a cross-sectional view of the substrate after metallization etch.

Now, as shown in FIG. 5, the Cr/Cu/Cr is etched using conventional methods. The photoresists 13 and 15 remain protecting the sides and top of the metal feature 16 from the etch.

Figure 6:
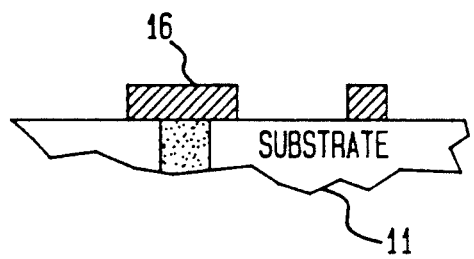
FIG. 6 is a cross-sectional view of the substrate after photoresist removal.

Finally, the remaining photoresist is removed using conventional methods leaving the desired metal pattern 16 behind, FIG. 6. The metal pattern 16 produced according to this process has no lateral shrinkage from the original photo mask dimensions because there is no undercut from the metal etchant and therefore an optimum cross-section can be achieved with thicknesses greater than conventional etch defined patterns.

In a specific implementation, the photoresist 13 was deposited to a thickness of five microns and the thickness of the Cu in layer 14 was about four microns on an alumina substrate (Example 1) and a glass-ceramic substrate (Example 2). Good results have been obtained in actual practice, as indicated by the following table.

|  | Example 1 | Example 2 |
| --- | --- | --- |
| average line width as photo developed | 17.2µ | 16.0µ |
| average line width after etch | 17.8µ | 17.4µ |

Considering measurement tolerances, the average line widths in Examples 1 and 2 are substantially the same before and after etch, thereby illustrating substantially no undercutting according to the present invention. Prior to the present invention, the lines after etch could be expected to be as thin as 5µ due to undercutting; e.g., less than 30% of the original width, due to undercutting.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A process for forming metal wiring patterns on substrates used to package electronic circuits and components comprising the steps of:

applying a first photoresist to a predetermined thickness over a substrate;

exposing and developing said first photoresist to define a desired metallization pattern;

applying a metal blanket over said developed first photoresist to a thickness less than said predetermined thickness forming said metallization pattern on the substrate;

applying a second photoresist over the metal blanket;

exposing and developing said second photoresist to provide a pattern image that covers that portion of the metal blanket which forms the metallization pattern on the substrate and partially overlaps the pattern image formed in said first photoresist so that the second photoresist protects the top of a metal feature desired and the first photoresist protects the edges of the metal feature;

etching the metal blanket exposed by said second photoresist; and removing the remaining first and second photoresists to produce a metal pattern having no lateral shrinkage from an original photo mask dimensions because there is no undercut and therefore an optimum cross-section is achieved.

2. The process of claim 1 further comprising the step of planarizing the substrate prior to applying the first photoresist.

3. The process recited in claim 1 wherein said metal blanket is a chromium/copper/chromium blanket.

4. The process recited in claim 1 wherein said predetermined thickness is in the range of three to approximately five microns.

5. The process recited in claim 4 wherein the thickness of said metal blanket is approximately one micron less than said predetermined thickness.

6. The process recited in claim 5 wherein said metal blanket is a chromium/copper/chromium blanket.

7. The process recited in claim 1 wherein the substrate is a ceramic or polymeric substrate.

* * * * *